United States Patent
Chen et al.

(10) Patent No.: US 11,037,869 B2
(45) Date of Patent: Jun. 15, 2021

(54) PACKAGE STRUCTURE AND PREPARATION METHOD THEREOF

(71) Applicant: Unimicron Technology Corp., Taoyuan (TW)

(72) Inventors: Fu-Yang Chen, Miaoli County (TW); Chun-Hsien Chien, New Taipei (TW); Cheng-Hui Wu, New Taipei (TW); Wei-Ti Lin, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 7 days.

(21) Appl. No.: 16/690,143

(22) Filed: Nov. 21, 2019

(65) Prior Publication Data
US 2021/0057320 A1    Feb. 25, 2021

(30) Foreign Application Priority Data
Aug. 21, 2019 (TW) .................. 108129892

(51) Int. Cl.
*H01L 21/48* (2006.01)
*H01L 23/498* (2006.01)

(52) U.S. Cl.
CPC .... *H01L 23/49822* (2013.01); *H01L 21/4857* (2013.01); *H01L 23/49833* (2013.01)

(58) Field of Classification Search
CPC ........... H01L 23/49822; H01L 21/4857; H01L 23/49833
See application file for complete search history.

(56) References Cited

U.S. PATENT DOCUMENTS

| 7,888,246 | B2 * | 2/2011 | Son | H01L 29/66795 |
| | | | | 438/486 |
| 8,119,515 | B2 * | 2/2012 | Kim | H01L 24/03 |
| | | | | 438/612 |
| 9,666,536 | B2 * | 5/2017 | Liu | H01L 21/4857 |
| 2006/0258139 | A1 * | 11/2006 | Iijima | H05K 3/062 |
| | | | | 438/612 |
| 2007/0161222 | A1 * | 7/2007 | Kim | H01L 24/05 |
| | | | | 438/612 |
| 2011/0195545 | A1 | 8/2011 | Wang | |
| 2012/0153467 | A1 | 6/2012 | Chi et al. | |
| 2016/0172292 | A1 | 6/2016 | Hsu et al. | |

FOREIGN PATENT DOCUMENTS

| TW | I476888 B | 3/2015 |
| TW | I616998 B | 3/2018 |

* cited by examiner

*Primary Examiner* — Nicholas J Tobergte
(74) *Attorney, Agent, or Firm* — CKC & Partners Co., LLC

(57) ABSTRACT

A method of preparing a package structure is provided, which includes providing a carrier plate including a supporting layer, a first release layer, and a first metal layer; forming a first dielectric layer over the first metal layer, the first dielectric layer having a plurality of holes, each of the holes having an end portion substantially coplanar with each other at a same plane; forming a plurality of conductive protrusions filling the holes, each of the conductive protrusions having a first end and a second end opposite thereto; forming a circuit layer structure including at least one circuit layer and at least one second dielectric layer, the circuit layer being connected to the second end, the second dielectric layer being disposed over the circuit layer; removing the carrier plate; and removing a portion of the first dielectric layer to expose the conductive protrusions. A package structure is also provided.

5 Claims, 8 Drawing Sheets

PACKAGE STRUCTURE AND PREPARATION METHOD THEREOF

CROSS-REFERENCE TO RELATED APPLICATION

This application claims priority to Taiwan Application Serial Number 108129892, filed on Aug. 21, 2019, which is herein incorporated by reference.

BACKGROUND

Field of Invention

The present disclosure relates to a package structure and a method of preparing the same, and more particularly to a package structure having conductive protrusions with high coplanarity and a method of preparing the same.

Description of Related Art

When a package substrate, a circuit board, or a carrier plate is to be bonded to a chip, conductive protrusions on the package substrate, the circuit board or the carrier plate should be bonded to conductive protrusions on the chip if a metal-metal direct bond (without using solder) method is used. In addition, when the package substrate, the circuit board or the carrier plate is directly metal-metal bonded to the chip, high coplanarity is required to achieve a high yield.

The conventional conductive protrusion process includes performing exposure development on a photoresist to form a hole with a high aspect ratio and then electroplating and filling copper to form the conductive protrusion. However, height uniformity of the conductive protrusions formed using this method is poor, and thus chemical or physical polishing are generally performed on the conductive protrusions to have higher coplanarity. However, the current industrial situation is that even if chemical or physical polishing has been used, the coplanarity still does not meet the needs of the industry, which also leads to high manufacturing costs and difficult to control specifications.

SUMMARY

In view of the above, an object of one embodiment of the present disclosure is to provide a package structure and a method of preparing the same that can solve the above issues.

In order to achieve the above object, an embodiment of the present disclosure provides a method of preparing a package structure, which includes: providing a carrier plate, the carrier plate including a support layer, a first metal layer, and a first release layer disposed between the support layer and the first metal layer; forming a first dielectric layer over the first metal layer, the first dielectric layer having a plurality of holes, in which each of the holes adjacent to the first metal layer has an end portion, and each of the end portions is substantially coplanar with each other at a same plane; forming a plurality of conductive protrusions, each of the conductive protrusions filling each of the holes, each of the conductive protrusions having a first end and a second end opposite thereto, in which each of the first ends corresponds to each of the end portions; forming a circuit layer structure over the first dielectric layer and the conductive protrusions, in which the circuit layer structure includes at least one circuit layer and at least one second dielectric layer, and the circuit layer is connected to the second end of each of the conductive protrusions, and the second dielectric layer is disposed over the circuit layer; separating the first dielectric layer from the carrier plate; and removing a portion of the first dielectric layer to expose each of the conductive protrusions.

In some embodiments, the carrier plate further includes a second metal layer and a second release layer disposed between the support layer and the second metal layer, and the first release layer and the second release layer are respectively disposed over two opposite surfaces of the supporting layer, in which in the step of forming the first dielectric layer, the first dielectric layer is formed over the first metal layer and the second metal layer, respectively.

In some embodiments, the at least one circuit layer is a plurality of circuit layers, and the at least one second dielectric layer is a plurality of second dielectric layers.

In some embodiments, a shape of each of the holes is controlled by laser, and each of the conductive protrusions is correspondingly formed.

In some embodiments, each of the conductive protrusions is cone-shaped or pyramid-shaped, and an end portion of each of the holes is not connected to the first metal layer.

An embodiment of the present disclosure provides a package structure, which includes a first dielectric layer, a plurality of conductive protrusions, and a circuit layer structure. The first dielectric layer has an upper surface and a lower surface opposite to each other. The conductive protrusions have first ends and second ends opposite to each other, and each of the conductive protrusions extends upwardly through the first dielectric layer, in which each of the first ends is disposed at a top portion of each of the conductive protrusions, and the first ends are substantially coplanar with each other at a same plane, in which the second ends are coplanar with the lower surface of the first dielectric layer. The circuit layer structure is disposed beneath the first dielectric layer, and the circuit layer structure includes a first circuit layer, a second dielectric layer, a plurality of first conductive holes and a second circuit layer. The first circuit layer is disposed beneath the lower surface of the first dielectric layer, and the second ends of the conductive protrusions are electrically connected to the first circuit layer. The second dielectric layer covers the first circuit layer and the first dielectric layer, and the second dielectric layer has a plurality of first openings exposing the first circuit layer. The first conductive holes are disposed in the first openings of the second dielectric layer, and the first conductive holes are electrically connected to the first circuit layer. The second circuit layer is disposed beneath the second dielectric layer and electrically connected to the first conductive holes.

In some embodiments, the package structure further includes a third dielectric layer covering the second circuit layer and the second dielectric layer and having at least one second opening exposing the second circuit layer.

In some embodiments, the conductive protrusion is cone-shaped, cylinder-shaped, trapezoidal column-shaped, or rectangle-shaped.

In some embodiments, the package structure further includes another package structure, and each of the first ends of each of the conductive protrusions of each of the package structures is bonded to each other.

In some embodiments, the package structure further includes a chip having a plurality of conductive contacts, and each of the first ends of each of the conductive protrusions is respectively bonded to each of the conductive contacts.

BRIEF DESCRIPTION OF THE DRAWINGS

In order to make the above and other objects, features, advantages and embodiments can be more fully understood, detailed description of the accompanying drawings as follows.

DETAILED DESCRIPTION

Figure 1:
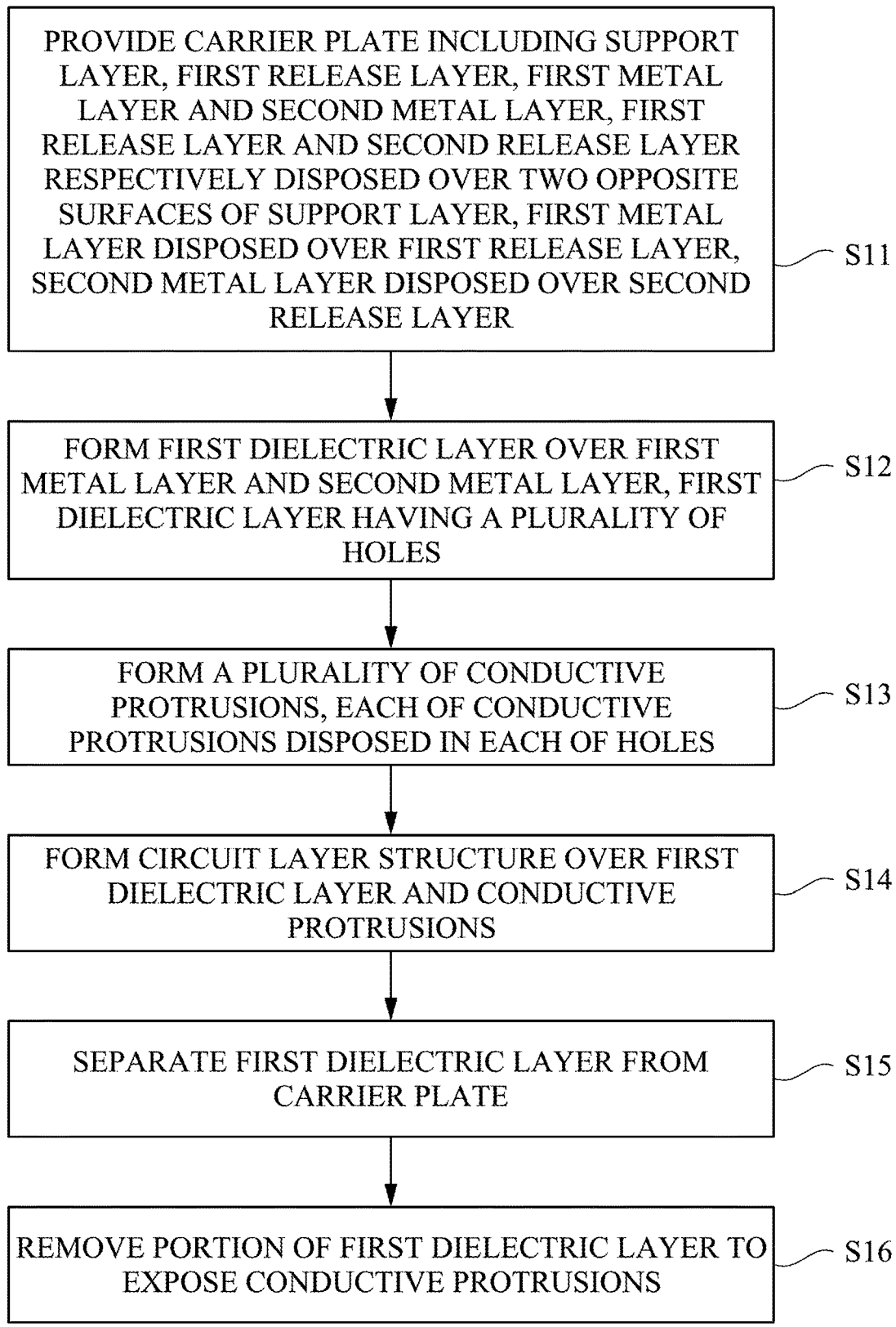
FIG. 1 is a flow chart showing a method of preparing a package structure according to an embodiment of the present disclosure.

In order that the present disclosure is described in detail and completeness, implementation aspects and specific embodiments of the present disclosure with illustrative description are presented, but it is not the only form for implementation or use of the specific embodiments of the present disclosure. The embodiments disclosed herein may be combined or substituted with each other in an advantageous manner, and other embodiments may be added to an embodiment without further description. In the following description, numerous specific details will be described in detail in order to enable the reader to fully understand the following embodiments. However, the embodiments of the present disclosure may be practiced without these specific details.

Further, spatially relative terms, such as "lower," "upper," "bottom," "top," and the like, are used to describe the relative relationship of an element or feature to other elements or features in the drawings. These spatially relative terms are intended to encompass different orientations of the device in use or operation in addition to the orientation shown in the drawings. The device can be otherwise positioned (e.g., rotated 90 degrees or other orientation), and the spatially relative descriptions used herein can also be correspondingly interpreted.

As used herein, unless the context specifically dictates otherwise, "a" and "the" may mean a single or a plurality. It will be further understood that "comprise", "include", "have", and similar words as used herein indicate features, regions, integers, steps, operations, elements and/or components, but not exclude other features, regions, integers, steps, operations, elements, components and/or groups.

Although a series of operations or steps are described below to illustrate the method disclosed herein, the order of the operations or steps is not to be construed as limiting. For example, certain operations or steps may be performed in a different order and/or concurrently with other steps. In addition, not all illustrated operations, steps, and/or features are required to implement embodiments of the present disclosure. Moreover, each of the operations or steps described herein can include a number of sub-steps or actions.

One aspect of the present disclosure provides a method of preparing a package structure. The package structure obtained by the preparation method can improve coplanarity of conductive protrusions of the package structure, and can improve a yield of bonding the package structure to the chip or the package structure. FIG. 1 is a flow chart showing a method 10 of preparing a package structure 100 according to an embodiment of the present disclosure, and FIGS. 2-11 are schematic cross-sectional views showing various process stages in the preparation method 10. As shown in FIG. 1, the method 10 includes steps S11 to S16.

Figure 2:
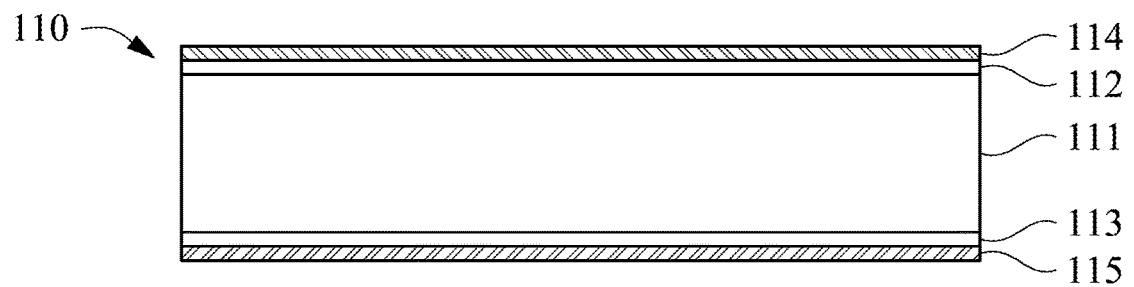
FIGS. 2-11 are schematic cross-sectional views showing various process stages in the preparation method according various embodiments of the present disclosure.

In the step S11, a carrier plate 110 is provided, as shown in FIG. 2. Specifically, the carrier plate 110 includes a support layer 111, a first release layer 112, a second release layer 113, a first metal layer 114, and a second metal layer 115. The first release layer 112 and the second release layer 113 are respectively disposed over two opposite surfaces of the support layer 111. The first metal layer 114 is disposed over the first release layer 112, and the second metal layer 115 is disposed over the second release layer 113. In some embodiments, the support layer 111 may be made of, for example, an organic polymeric material such as bismaleimide triazine (BT) or glass, and the support layer 111 may also be a copper clad laminate (CCL) with two opposite surfaces fully integrated with a dielectric material (e.g., a prepreg) (not shown). In some embodiments, the first release layer 112 and the second release layer 113 may each be a release film, or other techniques may be used to provide the first release layer 112 and the second release layer 113, such as a copper foil combined with a release layer provided by Mitsui, Nippon-Denk, Furukawa, or Olin. In some embodiments, the first metal layer 114 and the second metal layer 115 may have a thickness, for example, in a range of from 1 micrometer to 10 micrometers, but not limited thereto, and the first metal layer 114 and the second metal layer 115 may be made of, for example, copper, aluminum, nickel, silver, gold or an alloy thereof, but not limited thereto. In other embodiments, the first metal layer 114 and the second metal layer 115 are not limited to a single layer, and may be a laminate of a plurality of first metal layers 114 and a laminate of a plurality of second metal layers 115.

In another embodiment, another metal layer (not shown) may be disposed between the two opposite surfaces of the support layer 111 and the first release layer 112 or the second release layer 113, and the other metal layer has a thickness in a range of from 5 micrometers to 40 micrometers, and may be made of a material same as or different from the metal layer 114/115, such as copper, aluminum, nickel, silver, gold or an alloy thereof, but not limited thereto.

Figure 3:
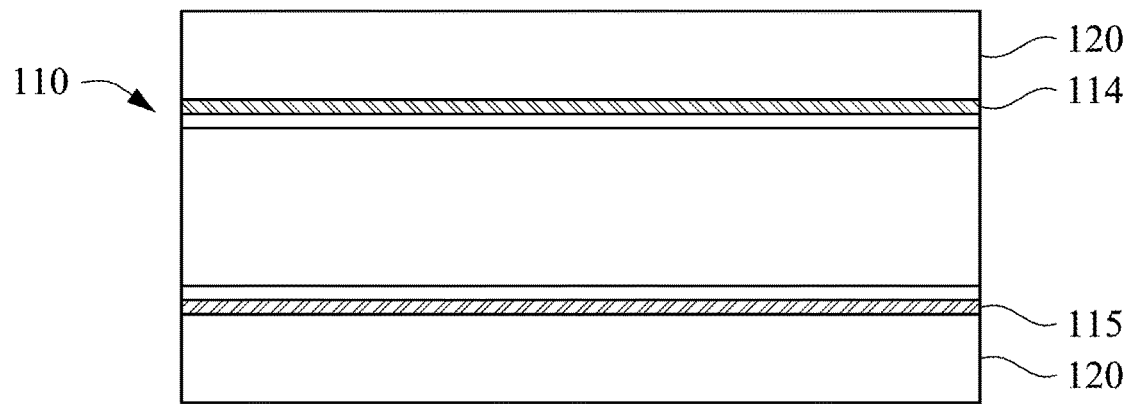

In the step S12, a first dielectric layer 120 is formed over the first metal layer 114 and the second metal layer 115, as shown in FIG. 3. It can be understood that the step S12 and the subsequent steps S13-S16 can be formed over a certain surface of the carrier plate 110 or formed over the two opposite surfaces of the carrier plate 110. In the present embodiment, the double-sided production of the carrier plate 110 will be described as an example. The first dielectric layer 120 may include resin or glass fiber. For example, the resin may be phenolic resin, epoxy resin, polyimide resin or polytetrafluoroethylene. Alternatively, the first dielectric layer 120 may also include photo-imageable dielectric. In some embodiments, the first dielectric layer 120 may be formed using, for example, lamination, coating, or other suitable processes.

Figure 4:
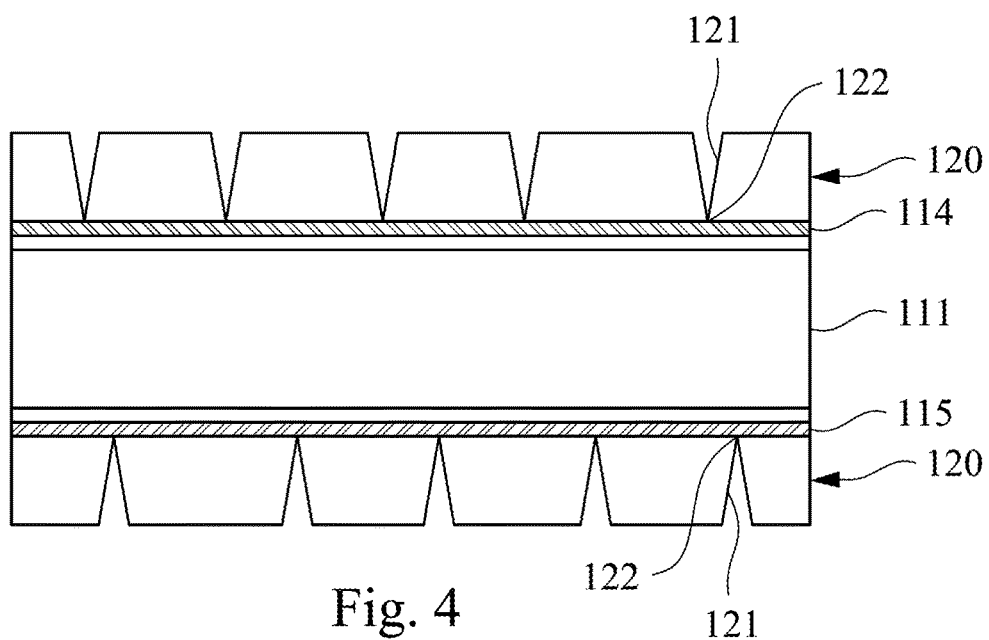

As shown in FIG. 4, the first dielectric layer 120 has a plurality of holes 121, in which each of the holes 121 has an end portion 122 adjacent to the first metal layer 114 or the second metal layer 115, and each end portion 122 is substantially coplanar with each other at a same plane. In some embodiments, the holes 121 are formed by controlling an aperture size of laser to have a uniform shape and a uniform depth such that the end portions 122 of the holes 121 are substantially coplanar with each other at the same plane. In an embodiment, "same plane" may refer to a same horizontal plane. In an embodiment, "same plane" may be parallel to a surface of the support layer 111.

Figure 5:
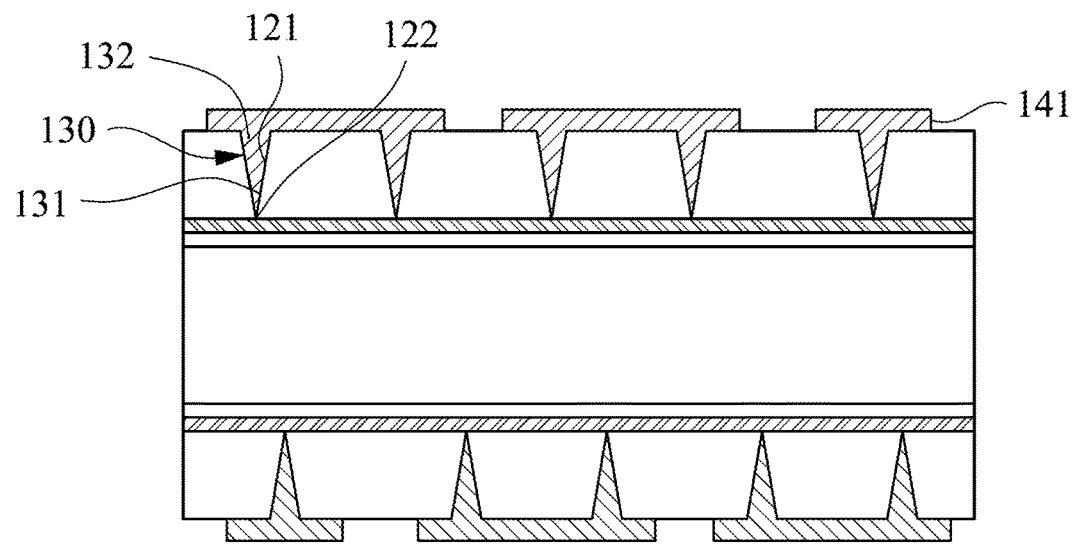

In the step S13, a plurality of conductive protrusions 130 are formed, and each of the conductive protrusions 130 fills each of the holes 121, as shown in FIG. 5. Each of the conductive protrusions 130 has a first end 131 and a second end 132 opposite thereto, in which each of the first ends 131 corresponds to each of the end portions 122. In some embodiments, the conductive protrusions 130 may be made of any conductive metal including, but not limited to, copper. Since the holes 121 controlled by the laser to have the uniform shape and the uniform depth in the step S12, the shape of each of the conductive protrusions 130 is formed correspondingly. In the present embodiment, each of the conductive protrusions 130 is cone-shaped, and each of the conductive protrusions 130 is substantially coplanar with each other at the same plane.

In the present embodiment, the first end 131 of each of the conductive protrusions 130 is cone-shaped, and it is easy to form an uneven tear when each of the first ends 131 is removed from the first metal layer 114 or the second metal layer 115 due to the small contact area if the first end 131 is in contact with the first metal layer 114 or the second metal layer 115. In order to keep the first ends 131 substantially coplanar with each other at the same plane, each of the end portions 122 of the holes 121 are not connected to the first metal layer 114. That is, each of the holes 121 formed by laser drilling is not a through hole, and the first metal layer 114 or the second metal layer 115 is not exposed.

Figure 6:
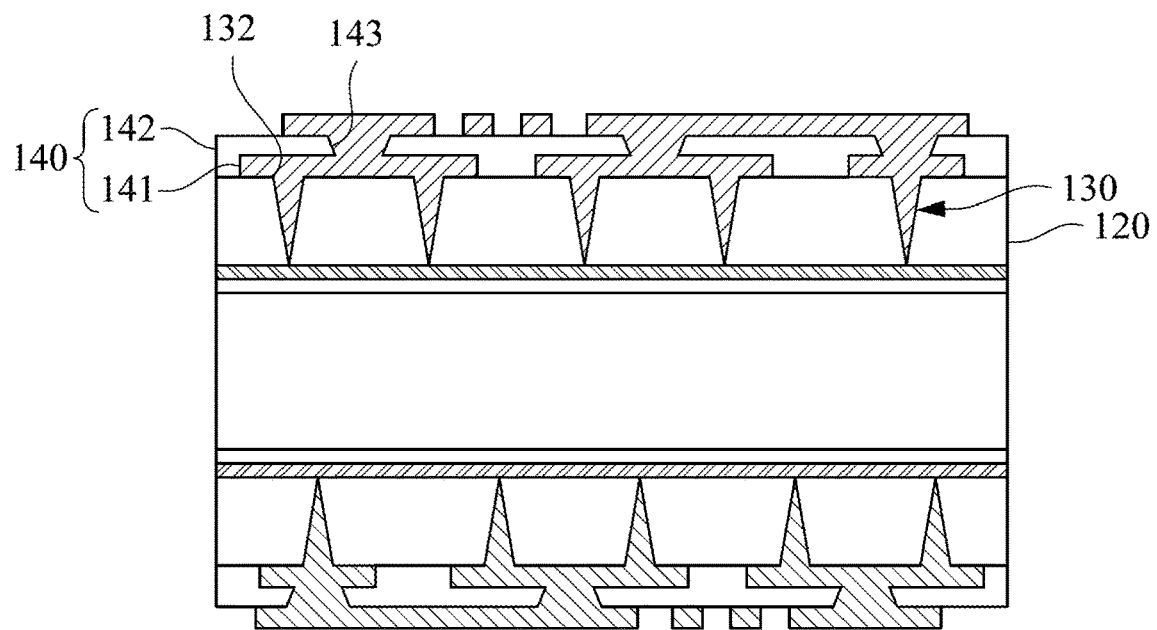
Figure 7:
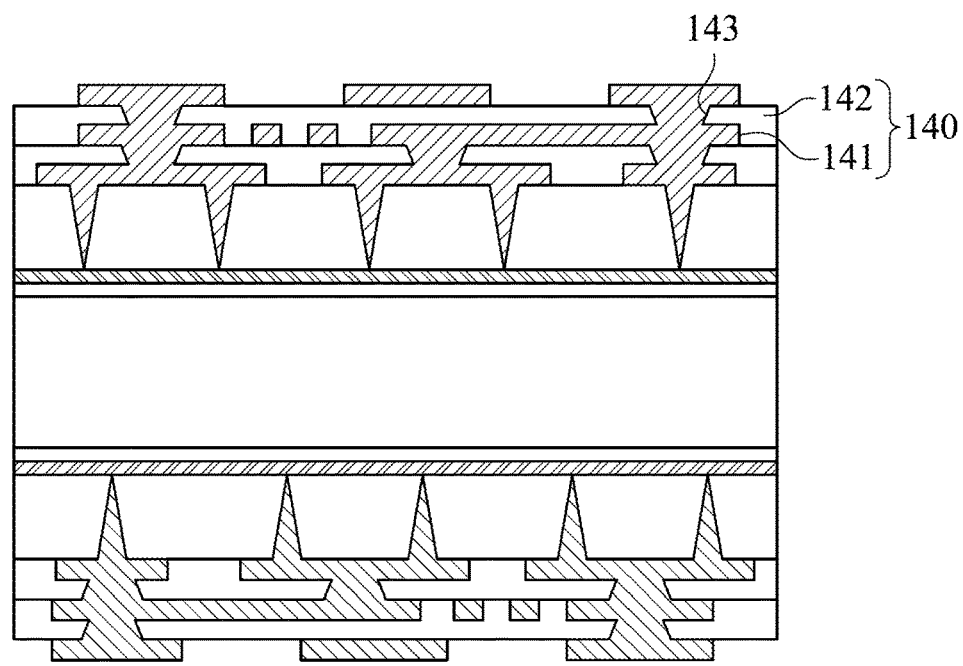

In the step S14, a circuit layer structure 140 is formed over the first dielectric layer 120 and the conductive protrusions 130, as shown in FIGS. 5-7. Specifically, the circuit layer structure 140 includes at least one circuit layer 141 and at least one second dielectric layer 142. Those skilled in the art to which the present disclosure pertains can flexibly select the number of layers of the dielectric layer and the circuit layer as needed. It can be understood that the minimum unit constituting the circuit layer structure 140 is a dielectric layer and a circuit layer. The circuit layer 141 is connected to the second end 132 of each of the conductive protrusions 130; in some embodiments, each of the conductive protrusions 130 is formed simultaneously with the bottommost circuit layer 141 and those are made of a same material. The second dielectric layer 142 is disposed over the circuit layer 141, in which the second dielectric layer 142 has a plurality of conductive holes 143 electrically connected to the circuit layer 141.

In some embodiments, the second dielectric layer 142 may include resin and glass fiber. For example, the resin may be phenolic resin, epoxy resin, polyimide resin or polytetrafluoroethylene. Alternatively, the second dielectric layer 142 may also include photo-imageable dielectric. In some embodiments, the second dielectric layer 142 can be formed using, for example, lamination, coating, or other suitable processes. In some embodiments, the required blind holes for forming the conductive holes 143 are formed by, but not limited to, performing laser ablation on the second dielectric layer 142 to form the blind hole, or performing exposure development on the second dielectric layer 142 made of the photo-imageable dielectric to form the blind holes for forming the conductive holes 143.

A method of forming the circuit layer 141 in accordance with some embodiments of the present disclosure is briefly described below. First, a photoresist layer (not shown) such as a dry film is formed over the first dielectric layer 120, and the photoresist layer is then patterned using a lithography process to expose a portion of the first dielectric layer 120. Thereafter, a plating process and a removal process of the photoresist layer are performed to form the circuit layer 141. A photoresist layer (not shown) such as a dry film is formed over the second dielectric layer 142, and the photoresist layer is then patterned using a lithography process to expose a portion of the second dielectric layer 142. Thereafter, a plating process and a removal process of the photoresist layer are performed to form the circuit layer 141 and the conductive holes 143. In an embodiment, the circuit layer 141 and the conductive holes 143 may be made of copper. In other embodiments, a seed layer (not shown) may be formed over the dielectric layer 120/142 before the circuit layer 141 is formed. The seed layer may be a single layer structure or a multilayer structure composed of sublayers of different materials, such as metal layers including a titanium layer and a copper layer on the titanium layer, or a palladium copper layer, etc., but not limited thereto. The seed layer may be formed using, but not limited to, a physical method such as sputtering of titanium copper, or a chemical method such as electroless plating of palladium copper layer.

Figure 8:
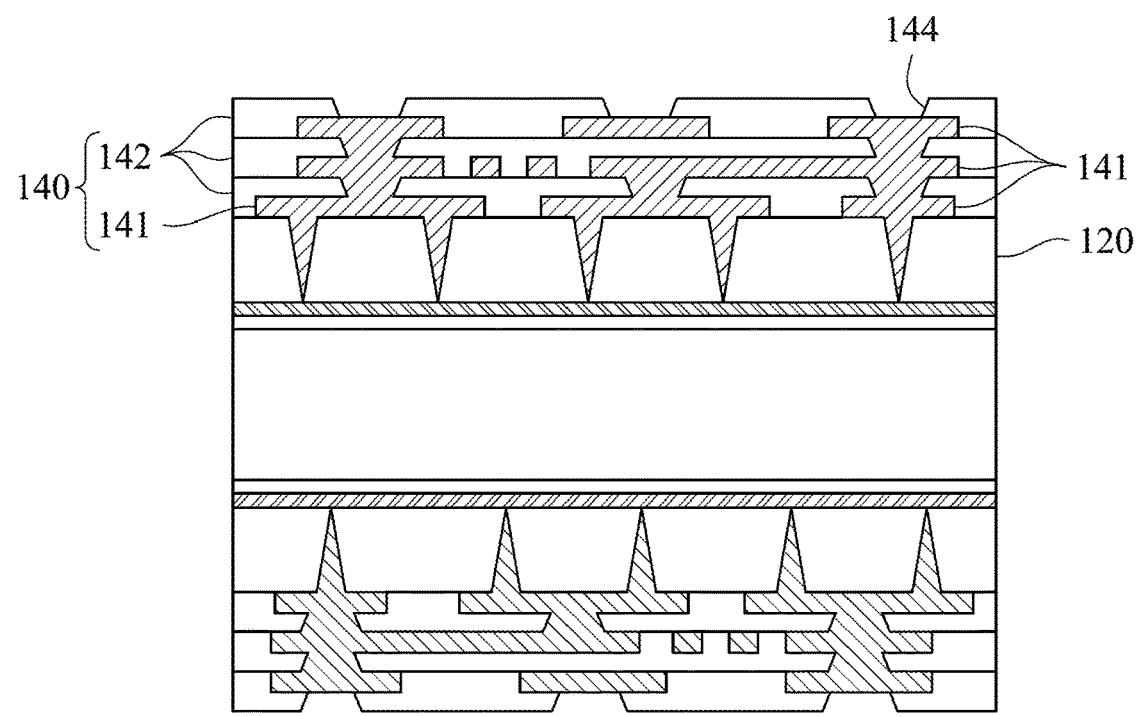

In some embodiments, the circuit layer structure 140 includes a plurality of circuit layers 141 and a plurality of second dielectric layers 142, in which the uppermost second dielectric layer 142 serves as a protective layer, as shown in FIG. 8, in which the protective layer has a plurality of openings 144 such that portions of a surface of the circuit layer structure 140 is exposed in the openings 144. Specifically, as shown in FIG. 8, the portions of the surface of the circuit layer 141 of the outermost layer of the circuit layer structure 140 are exposed in the openings 144. In various embodiments, the protective layer may be made of a solder resist material or a resin material such as epoxy resin. Alternatively, the protective layer may be made of a material same as that of the first dielectric layer 120 or the second dielectric layer 142. The protective layer may be formed using, for example, lamination, printing, or coating.

Figure 9:
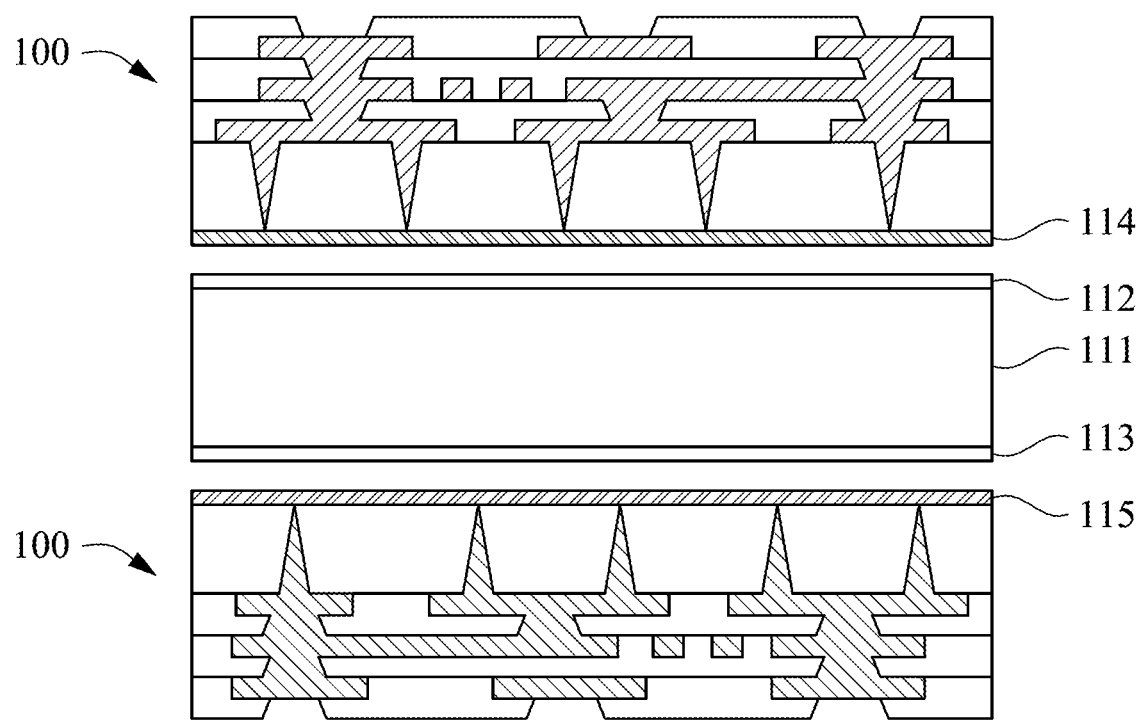
Figure 10:
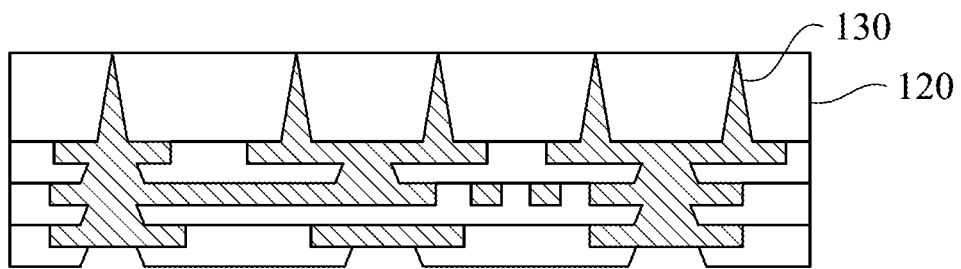

In the step S15, the first dielectric layer 120 is separated from the carrier plate 110, as shown in FIGS. 9-10. The support layer 111, the first release layer 112, and the second release layer 113 are removed from the structure illustrated in FIG. 8 to form two package structures 100. Next, the first metal layer 114 and the second metal layer 115 are removed. In an embodiment, the first metal layer 114 and the second metal layer 115 may be removed using, but not limited to, etching.

Figure 11:
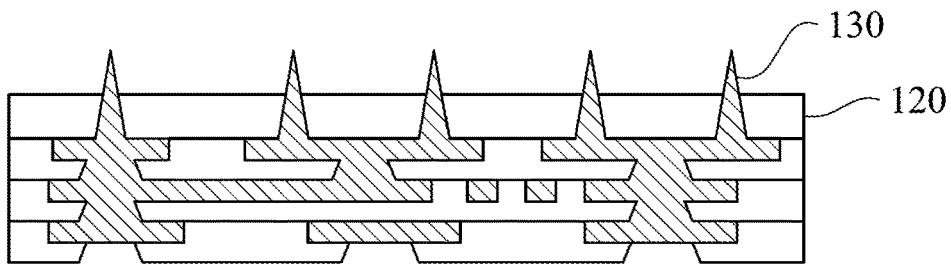

In the step S16, a portion of the first dielectric layer 120 is removed to expose the conductive protrusions 130, as shown in FIGS. 10-11. In an embodiment, the first dielectric layer 120 is removed using, but not limited to, plasma thinning. In the present embodiment, each of the conductive protrusions 130 is cone-shaped.

Figure 12:
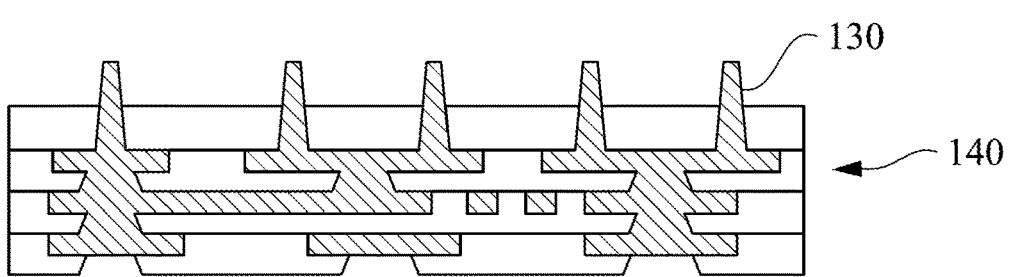
FIGS. 12-15 are schematic cross-sectional views showing a package structure according to another embodiment of the present disclosure.

FIG. 12 is a schematic cross-sectional view showing a package structure 200 according to another embodiment of the present disclosure. The package structure 200 includes a plurality of conductive protrusions 130 and a circuit layer structure 140. Compared with the package structure 100 illustrated in FIG. 11, the conductive protrusions 130 over the package structure 200 illustrated in FIG. 12 are trapezoidal column-shaped. The preparing method of the package structure 200 of the present embodiment is similar to that of the package structure 100 described above, except that the shape of the holes 121 (corresponding to FIG. 5) in step S13 is controlled by laser such that each of the conductive protrusions 130 is correspondingly formed with the trapezoidal column shape. In an embodiment, the end portion 122 of each of the holes 121 may be connected to the first metal layer 114. That is, the holes 121 formed using laser drilling may be through holes to expose the first metal layer 114 or the second metal layer 115. In another embodiment, the end portion 122 of each of the holes 121 is not connected to the first metal layer 114. That is, the holes 121 formed using laser drilling are not through holes such that the first metal layer 114 or the second metal layer 115 are not exposed.

Figure 13:
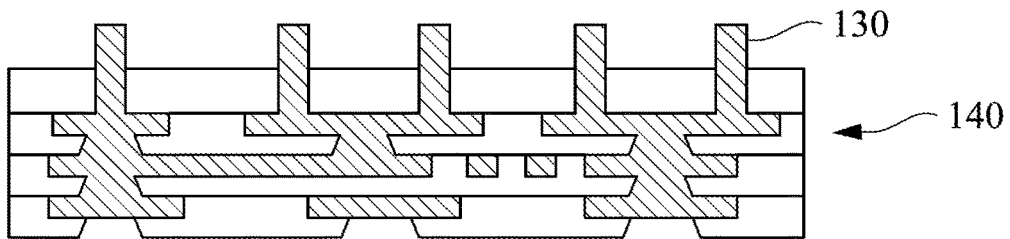

FIG. 13 is a schematic cross-sectional view showing a package structure 300 according to another embodiment of the present disclosure. The package structure 300 includes a plurality of conductive protrusions 130 and a circuit layer structure 140. Compared with the package structure 100 illustrated in FIG. 11, the conductive protrusions 130 over the package structure 300 illustrated in FIG. 13 are rectangle-shaped. The preparing method of the package structure 300 of the present embodiment is similar to that of the package structure 100 described above, except that the shape of the holes 121 (corresponding to FIG. 5) in step S13 is controlled by laser such that each of the conductive protrusions 130 is correspondingly formed with the rectangular shape.

Figure 14:
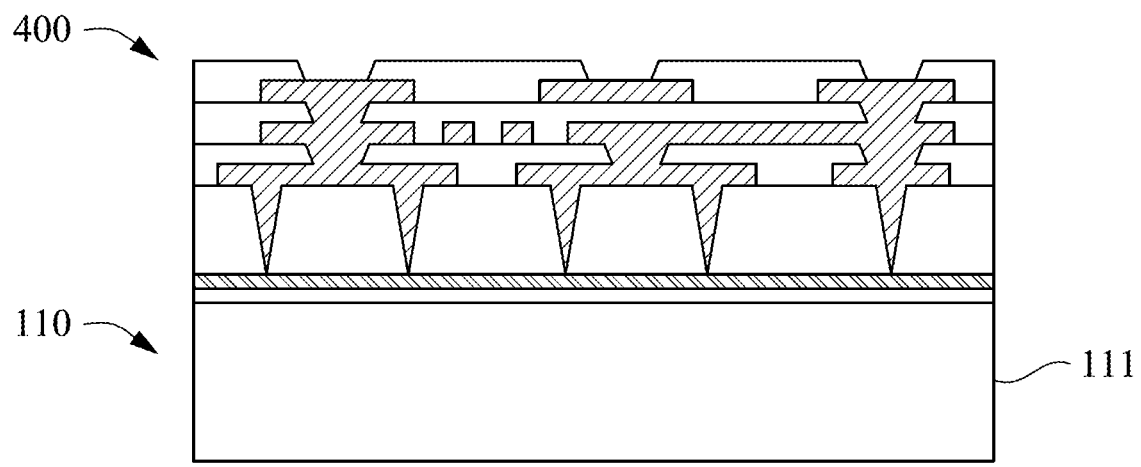

One embodiment of the present disclosure provides a method of preparing another package structure, as shown in FIG. 14, which is a cross-sectional view of the package structure 400 of the present embodiment. The method of preparing the package structure 400 is substantially similar to that of the package structure 100, except that the method of preparing the package structure 400 is performed on one side of the carrier plate 110 to form the package structure 400. Each layer, each component, and materials of the layers and the components in the single-sided production have been discussed in the foregoing, and will not be repeated here. In some embodiments, the support layer 111 may be made of glass. Due to the rigidity and flatness of the glass material, warping of two ends of the support layer 111 can be avoided. Therefore, when the support layer 111 is made of glass, the processes may be performed on two opposite surfaces of the support layer 111 to form the package structures 100 or performed on one surface of the support layer 111 to form the package structure 400.

Figure 15:
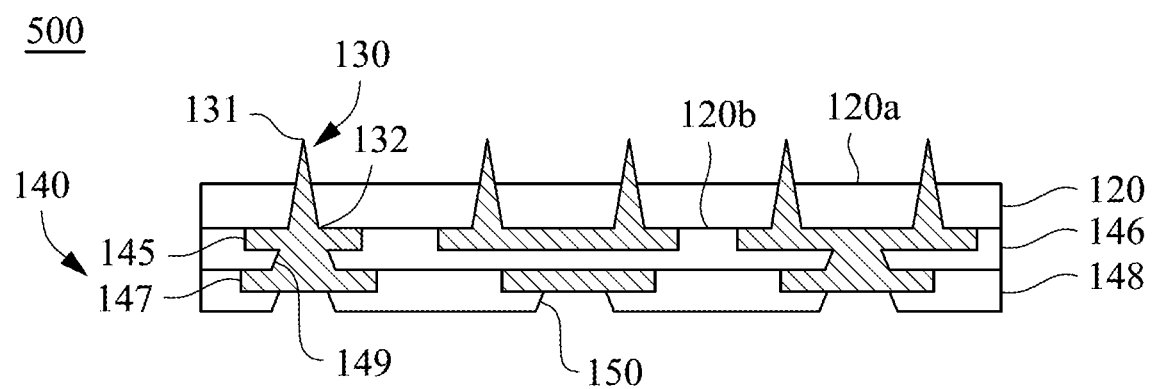

FIG. 15 is a schematic cross-sectional view showing a package structure 500 according to another embodiment of the present disclosure. The package structure 500 includes a first dielectric layer 120, a plurality of conductive protrusions 130, and a circuit layer structure 140. The first dielectric layer 120 has upper and lower surfaces 120a, 120b opposite to each other. The conductive protrusions 130 have first and second ends 131 and 132 opposite to each other, and each of the conductive protrusions 130 extends upwardly through the first dielectric layer 120. Each of the first ends 131 is disposed at a top portion of each of the conductive protrusions 130 (i.e., each of the first ends 131 is higher than the upper surface 120a), and the first ends 131 are substantially coplanar with each other at a same plane. These second ends 132 are coplanar with the lower surface 120b of the first dielectric layer 120. The circuit layer structure 140 is disposed beneath the first dielectric layer 120. The circuit layer structure 140 includes a first circuit layer 145, a second dielectric layer 146, a second circuit layer 147, a plurality of first conductive holes 149, and a third dielectric layer 148. The first circuit layer 145 is disposed beneath the lower surface 120b of the first dielectric layer 120, and the second ends 132 of the conductive protrusions 130 are electrically connected to the first circuit layer 145. The second dielectric layer 146 covers the first circuit layer 145 and the first dielectric layer 120 and has a plurality of first openings exposing the first circuit layer 145. The plurality of first conductive holes 149 are disposed in the first openings of the second dielectric layer 146, and the first conductive holes 149 are electrically connected to the first circuit layer 145. The second circuit layer 147 is disposed beneath the second dielectric layer 146 and electrically connected to the first conductive holes 149. The third dielectric layer 148 covers the second dielectric layer 146 and the second circuit layer 147 and has at least one second opening 150 exposing the second circuit layer 147. In an embodiment, the third dielectric layer 148 is also referred to as a solder resist layer, and may be made of a solder resist material or a resin material such as epoxy resin. The solder resist layer may be formed using, for example, lamination, printing, or coating.

Figure 16:
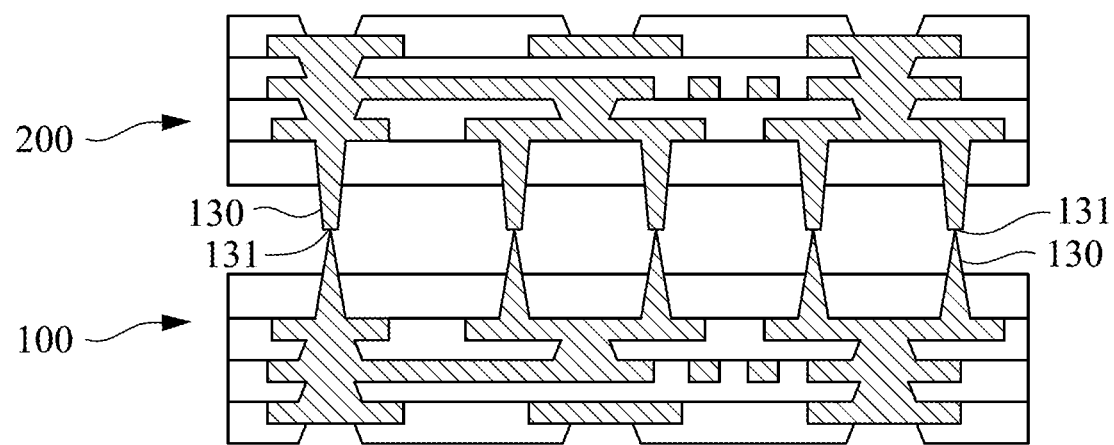
FIG. 16 is a cross-sectional view showing a metal-metal direct bond of two package structures according to some embodiments of the present disclosure.

One embodiment of the present disclosure provides conductive protrusions having high coplanarity, such that two package structures may be directly metal-metal bonded to each other, as shown in FIG. 16. The lower package structure 100 and the upper package structure 200 are bonded to each other through the first ends 131 of the conductive protrusions 130.

Figure 17:
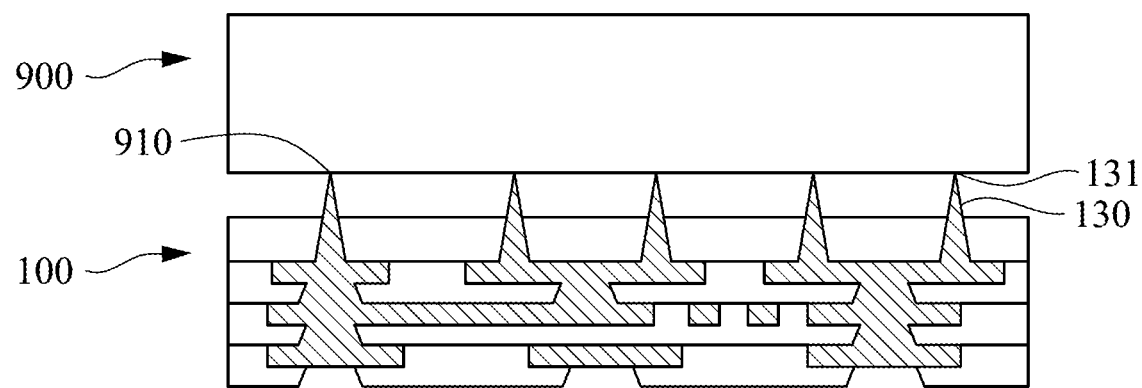
FIG. 17 is a cross-sectional view showing a metal-metal direct bond of a package structure and a chip according to some embodiments of the present disclosure.

One embodiment of the present disclosure provides conductive protrusions having high coplanarity, such that the package structure 100 may be directly metal-metal bonded to the chip 900, as shown in FIG. 17. The chip 900 has a plurality of conductive contacts 910, and the conductive contacts 910 are directly bonded to the first ends 131, respectively.

In the package structure and the method of preparing the same according to an embodiment of the present disclosure, a preparing method of an embedded trace substrate (ETS) is combined with the holes having the controllable uniform depth to form the conductive protrusions with high coplanarity to replace the conventional method of chemically polishing or physically polishing a copper column. Specifically, after laser drilling is performed on the dielectric layer to form the holes having the uniform depth, the conductive protrusions having high coplanarity and the circuit layer are formed, and portions of the dielectric layer are then removed to expose the conductive protrusions. Therefore, the conductive protrusions having high coplanarity may be used during direct metal-metal bonding between the package structure and the chip, or between two circuit boards, or between two package structures to have a higher yield.

Although the disclosure has been disclosed in the above embodiments, it is not intended to limit the disclosure, and it is to be understood that those skilled in the art can make various changes and modifications without departing from the spirit and scope of the disclosure. The scope of protection of the present disclosure is subject to the definition of the scope of claims.

What is claimed is:
1. A method of preparing a package structure, comprising:
providing a carrier plate, the carrier plate including a support layer, a first metal layer, and a first release layer disposed between the support layer and the first metal layer;
forming a first dielectric layer over the first metal layer, the first dielectric layer having a plurality of holes, wherein each of the holes adjacent to the first metal layer has an end portion, and each of the end portions is substantially coplanar with each other at a same plane;

forming a plurality of conductive protrusions, each of the conductive protrusions filling each of the holes, each of the conductive protrusions having a first end and a second end opposite thereto, wherein each of the first ends corresponds to each of the end portions;

forming a circuit layer structure over the first dielectric layer and each of the conductive protrusions, wherein the circuit layer structure comprises at least one circuit layer and at least one second dielectric layer, and the circuit layer is connected to the second end of each of the conductive protrusions, and the second dielectric layer is disposed over the circuit layer;

separating the first dielectric layer from the carrier plate; and removing a portion of the first dielectric layer to expose each of the conductive protrusions.

2. The method of preparing the package structure of claim 1, wherein the carrier plate further comprises a second metal layer and a second release layer disposed between the support layer and the second metal layer, and the first release layer and the second release layer are respectively disposed over two opposite surfaces of the supporting layer, wherein in the step of forming the first dielectric layer, the first dielectric layer is formed over the first metal layer and the second metal layer, respectively.

3. The method of preparing the package structure of claim 1, wherein the at least one circuit layer is a plurality of circuit layers, and the at least one second dielectric layer is a plurality of second dielectric layers.

4. The method of preparing the package structure of claim 1, wherein a shape of each of the holes is controlled by laser, and each of the conductive protrusions is correspondingly formed.

5. The method of preparing the package structure of claim 1, wherein each of the conductive protrusions is cone-shaped, and an end portion of each of the holes is not connected to the first metal layer.

* * * * *